(12) United States Patent
Zhou et al.

(10) Patent No.: US 12,715,779 B2
(45) Date of Patent: Aug. 25, 2026

(54) PREPARATION METHOD OF QUANTUM DOT LIGHT EMITTING DIODE

(71) Applicant: TCL TECHNOLOGY GROUP CORPORATION, Huizhou (CN)

(72) Inventors: Likuan Zhou, Huizhou (CN); Yixing Yang, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 324 days.

(21) Appl. No.: 18/270,715

(22) PCT Filed: Dec. 27, 2021

(86) PCT No.: PCT/CN2021/141739

§ 371 (c)(1),
(2) Date: Jun. 30, 2023

(87) PCT Pub. No.: WO2022/143551

PCT Pub. Date: Jul. 7, 2022

(65) Prior Publication Data

US 2024/0164133 A1 May 16, 2024

(30) Foreign Application Priority Data

Dec. 31, 2020 (CN) ........................ 202011639291.0

(51) Int. Cl.
*C01G 9/02* (2006.01)
*B82Y 20/00* (2011.01)
(Continued)

(52) U.S. Cl.
CPC ............... *C01G 9/02* (2013.01); *H10K 50/16* (2023.02); *H10K 85/1135* (2023.02);
(Continued)

(58) Field of Classification Search
CPC ..... H05B 44/00; H10H 20/812; H10H 20/816
See application file for complete search history.

(56) References Cited

U.S. PATENT DOCUMENTS

2020/0321490 A1* 10/2020 Yang .................... H10H 20/812

FOREIGN PATENT DOCUMENTS

CN 108183173 A * 6/2018 ........... H10K 50/115
CN 109755417 A 5/2019
(Continued)

OTHER PUBLICATIONS

Jong, Hun Yu et al. "Improvement of the electron transport behavior in quantum-dot light-emitting diodes using a low-temperature processable ZnO" Current Applied Physics, vol. 20, No. 2, Dec. 20, 2019 (Dec. 20, 2019), pp. 366-370 (Year: 2019).*
(Continued)

*Primary Examiner* — Edward Chin

(57) ABSTRACT

A preparation method of quantum dot light emitting diode, including steps of: providing a prefabricated device, and forming zinc oxide nanomaterial on the prefabricated device, to prepare an electron transport layer; and performing heat treatment to the processed device, such that an amount of surface hydroxyl groups of the electron transport layer is 0.15-0.6. Through the heat treatment to the device provided with the electron transport layer, the amount of the surface hydroxyl groups of the electron transport layer is regulated, the fluorescence quenching effect of the surface hydroxyl groups of the electron transport layer to the quantum dot light-emitting layer is reduced; meanwhile, the heat treatment may reduce the amount of the surface hydroxyl groups of the electron transport layer, and as the number of the surface hydroxyl groups of the zinc oxide decreases, the electron and hole injection balance is optimized, the carrier radiation recombination efficiency is improved.

11 Claims, 2 Drawing Sheets

(51) Int. Cl.
*B82Y 40/00* (2011.01)
*H10K 50/16* (2023.01)
*H10K 71/40* (2023.01)
*H10K 85/10* (2023.01)

(52) U.S. Cl.
CPC ............... *B82Y 20/00* (2013.01); *B82Y 40/00* (2013.01); *H10K 71/40* (2023.02)

(56) References Cited

FOREIGN PATENT DOCUMENTS

| | | | |
|---|---|---|---|
| CN | 109980099 | A | 7/2019 |
| CN | 111384278 | A | 7/2020 |
| CN | 111584731 | A | 8/2020 |
| CN | 106654026 | A | 2/2022 |
| KR | 20140115933 | A | 10/2014 |

OTHER PUBLICATIONS

International Search Report dated Mar. 9, 2022; International Application No. PCT/CN2021/141739; 2 pages.

Written Opinion dated Mar. 9, 2022; International Application No. PCT/CN2021/141739; 6 pages.

Jong, Hun Yu et al. “Improvement of the electron transport behavior in quantum-dot light-emitting diodes using a low-temperature processable ZnO” Current Applied Physics, vol. 20, No. 2. Dec. 20, 2019 (Dec. 20, 2019), pp. 366-370.

Hong Hee Kim et al., Optimization of the electron transport in quantum dot light-emitting diodes by codoping ZnO with gallium (Ga) and magnesium (Mg), RSC Advances, vol. 9, Oct. 9, 2019, 32066-32071.

* cited by examiner

FIG. 1

PREPARATION METHOD OF QUANTUM DOT LIGHT EMITTING DIODE

CROSS-REFERENCE TO RELATED APPLICATIONS

This disclosure is a 35 U.S.C. § 371 national stage application of PCT application No. PCT/CN2021/141739, filed on Dec. 27, 2021, which claims the benefit of Chinese Patent Application No. 202011639291.0, entitled PREPARATION METHOD OF QUANTUM DOT LIGHT EMITTING DIODE, which was filed with China National Intellectual Property Administration on Dec. 31, 2020, and the entire contents each of which are incorporated herein by reference.

TECHNICAL FIELD

The present disclosure relates to the technical field of display, and more particularly, relates to a preparation method of quantum dot light emitting diode.

BACKGROUND

Having many advantages such as high brightness, low power consumption, wide color gamut, and easy processing, quantum dot light emitting diodes (QLEDs) have received wide attention and research in the field of lighting and display in recent years. QLED can realize full-color display and solid-state lighting with self-illumination and low power consumption, and is therefore considered to be the development trend of next-generation display and lighting. After twenty years of rapid development, QLED has obtained good performance parameters.

With the research development of quantum dot light emitting diode devices, nano-zinc oxide is widely used as material of an electron transport layer. However, as the electron transport layer material, zinc oxide is stacked with an adjacent quantum dot light-emitting layer, and hydroxyl groups on the surface of the zinc oxide can generate a quenching effect on the quantum dot light-emitting layer, especially when the amount of the surface hydroxyl groups of the zinc oxide exceeds a certain range. The quantum dot fluorescence can be quenched to a certain extent, resulting in a poor photoelectric performance (EQE and service life) of the device.

SUMMARY

One objective of the embodiments of the present disclosure is to provide a preparation method of quantum dot light emitting diode.

The technical solutions adopted in the embodiments of the present disclosure are as follows:

A preparation method of quantum dot light emitting diode, includes steps of:

- providing a prefabricated device, and forming zinc oxide nanomaterial on the prefabricated device, to prepare an electron transport layer; and
- performing heat treatment to the processed device, such that an amount of surface hydroxyl groups of the electron transport layer is 0.15-0.6.

In some embodiments, the heat treatment temperature is 80° C.-180° C.

In some embodiments, the heat treatment time is 1-60 min.

In some embodiments, the amount of the surface hydroxyl groups of the zinc oxide nanomaterial is less than or equal to 0.4, and the heat treatment temperature is 80° C.-100° C.

In some embodiments, the amount of the surface hydroxyl groups of the zinc oxide nanomaterial is 0.4-0.8, and the heat treatment temperature is 100° C.-120° C.

In some embodiments, the amount of the surface hydroxyl groups of the zinc oxide nanomaterial is greater than or equal to 0.8, and the heat treatment temperature is 130° C.-180° C.

In some embodiments, the prefabricated device is a cathode substrate;

- after having prepared the electron transport layer, the method further includes steps of:
- preparing a quantum dot light-emitting layer on the electron transport layer, and preparing an anode on the quantum dot light-emitting layer, to obtain the quantum dot light emitting diode.

In some embodiments, the heat treatment is performed after the step of preparing the electron transport layer or before the step of preparing the quantum dot light-emitting layer on the electron transport layer.

In some embodiments, the heat treatment is performed after preparing the anode.

In some embodiments, the prefabricated device includes an anode substrate, and a quantum dot light-emitting layer coupled to the anode substrate;

- after having prepared the electron transport layer, the method further includes a step of:
- preparing a cathode on the electron transport layer, to obtain the quantum dot light emitting diode.

In some embodiments, in case where the prefabricated device includes the anode substrate and the quantum dot light-emitting layer coupled on the anode substrate, the heat treatment is performed after the step of preparing the electron transport layer or before the step of preparing the cathode on the electron transport layer.

In some embodiments, the heat treatment is performed after preparing the cathode.

In some embodiments, the quantum dot light-emitting layer is a red-light quantum dot light-emitting layer, and the amount of the surface hydroxyl groups of the electron transport layer is 0.45-0.6.

In some embodiments, the quantum dot light-emitting layer is a green-light quantum dot light-emitting layer, and the amount of the surface hydroxyl groups of the electron transport layer is 0.3-0.45.

In some embodiments, the quantum dot light-emitting layer is a blue-light quantum dot light-emitting layer, and the amount of the surface hydroxyl groups of the electron transport layer is 0.15-0.3.

In some embodiments, the anode is selected from one or more of indium tin oxide, fluorine-doped tin oxide, indium zinc oxide, graphene, and carbon nanotubes.

In some embodiments, material of a hole injection layer is one or more of PEDOT: PSS, nickel oxide, molybdenum oxide, tungsten oxide, vanadium oxide, molybdenum sulfide, tungsten sulfide, and copper oxide.

In some embodiments, material of a hole transport layer is selected from one or more of PVK, Poly-TPD, CBP, TCTA, and TFB.

In some embodiments, the cathode is selected from one or more of Al, Ca, Ba, and Ag.

In some embodiments, heating manner of the heat treatment is hot plate heating, oven heating, or infrared heating.

The preparation method of quantum dot light emitting diode provided by the embodiments of the present disclosure has the following beneficial effects: through the heat treatment to the device provided with the electron transport layer, the amount of the surface hydroxyl groups of the electron transport layer is regulated, the fluorescence quenching effect of the surface hydroxyl groups of the electron transport layer to the quantum dot light-emitting layer is reduced; meanwhile, the heat treatment may reduce the amount of the surface hydroxyl groups of the electron transport layer, and as the number of the surface hydroxyl groups of the zinc oxide decreases, the electron and hole injection balance is optimized, the carrier radiation recombination efficiency is improved, and the EQE of the device and the service life of the device in working state are improved.

BRIEF DESCRIPTION OF THE DRAWINGS

To more clearly illustrate the technical solutions in the embodiments of the disclosure, the figures to be referenced in the description of the embodiments or prior art will be briefly described in the following. Apparently, the described figures are merely some of the embodiments of the present disclosure, and it is possible for those skilled in the art to obtain other figures on the basis of these figures without paying creative labor.

FIG. 1 is a flow chart of a preparation process of a quantum dot light emitting diode provided in the embodiments of this disclosure;

DETAILED DESCRIPTION OF THE EMBODIMENTS

Figure 2:
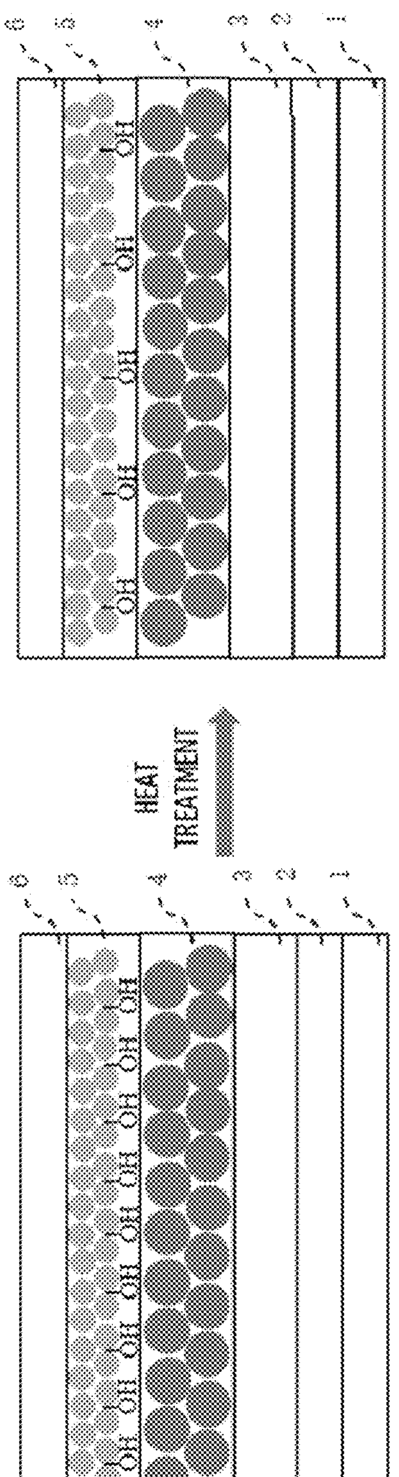
FIG. 2 is a schematic diagram showing changes in the number of the surface hydroxyl groups of the electron transport layer before and after the heat treatment provided in Embodiment 1.

In order to make the technical problems to be solved by this disclosure, technical solutions, and beneficial effects clearer, this disclosure is further described in detail below with reference to the embodiments. It should be understood that the specific embodiments described herein are merely used to explain this disclosure, and are not intended to limit this disclosure.

In the claims and specific embodiments of this disclosure, the term "and/or" describes an association relationship of associated objects, and indicates three possible relationships. For example, A and/or B may indicate three situations, where A exists alone, both A and B exist at the same time, and B exists alone. In this case, A, B may be singular or plural. The character "/" generally indicates that the associated objects before and after it are in an "or" relationship.

In this disclosure, "at least one" means one or more, and "a plurality of" means two or more. "At least one of the following items", or the like, refers to any combination of these items, including any combination of a single item (one) or a plurality of items (ones). For example, "at least one (item) of a, b, or c", or "at least one (item) of a, b, and c" may both represent: a, b, c, a-b (i.e., a and b), a-c, b-c, or a-b-c, where a, b, and c may be singular or plural.

It should be understood that, in various embodiments of this disclosure, the serial numbers of the above processes do not indicate the execution order. Some or all of the steps may be executed in parallel or executed in sequence. The execution order of the respective processes should be determined by the function and internal logic thereof, and should not constitute any limitation on the implementation process of the embodiments of this disclosure.

The terms used in the embodiments of this disclosure are for the purpose of describing particular embodiments only and are not intended to be limiting this disclosure. As used in the embodiments of this disclosure and the appended claims, the singular forms "a", "said" and "the" are also intended to include the plural forms unless indicated otherwise in the contexts.

The terms "first" and "second" are used for descriptive purposes only and are used to distinguish targets, such as substances, interfaces, messages, requests, and terminals from each other, and cannot be understood as indicating or implying relative importance or implicitly indicating the number of technical features indicated. For example, without departing from the scope of the embodiments of this disclosure, the first XX may also be referred to as the second XX, similarly, the second XX may also be referred to as the first XX. Therefore, the feature defined with "first" and "second" may explicitly or implicitly include one or more of the features.

The weight of the related compositions mentioned in the embodiments of the disclosure may not only refer to the specific content of each composition, but may also represent the proportional relationship between the weights among the compositions. Therefore, all contents fall into the scope of the disclosure of the description of the embodiments of the disclosure, as long as they are scaled up or down according to the contents of the related compositions in the description of the embodiments of this disclosure. Specifically, the mass in the description of the embodiments of the disclosure may use mass units commonly known in chemical fields such as μg, mg, g, kg.

In a quantum dot light emitting diode, in case where the material of the electron transport layer is zinc oxide, there is a good energy level matching between the zinc oxide and the cathode and between the zinc oxide and the quantum dot light-emitting layer, which significantly reduces the injection barrier of electrons from the cathode to the quantum dot light-emitting layer, and the relatively deep valence band energy level can also effectively block the holes. On the other hand, the zinc oxide material also has excellent electron transport capability with an electron mobility up to $10^{-3}$ $cm^2/V$ S, which is beneficial to improving the electron injection performance of the device. In the process from preparing zinc oxide to preparing the ink, the number of surface hydroxyl groups of the zinc oxide is a guarantee that it can be dispersed in the solvent. Meanwhile, the electron mobility of a zinc oxide thin film is directly related to the amount of surface hydroxyl groups of the zinc oxide, that is, the electron mobility is low in case where the amount of the hydroxyl groups is high, and the electron mobility is high in case where the amount of the hydroxyl groups is low. However, as the electron transport layer material, zinc oxide is stacked with the adjacent quantum dot light-emitting layer, and hydroxyl groups on the surface of zinc oxide can generate a quenching effect on the quantum dot light-emitting layer, especially when the amount of the surface hydroxyl groups of the zinc oxide exceeds a certain range. The quantum dot fluorescence can be quenched to a certain extent, resulting in a poor photoelectric performance (EQE and service life) of the device. In view of this, the embodiments of the present disclosure provide a preparation method of quantum dot light emitting diode, so as to solve the problem of existing quantum dot light emitting diodes that the surface hydroxyl groups of the zinc oxide generates a certain quenching on the quantum dot fluorescence, thereby affecting the photoelectric performance (EQE and service life) of the device in case where zinc oxide is used as an electron transport layer material.

Figure 1:
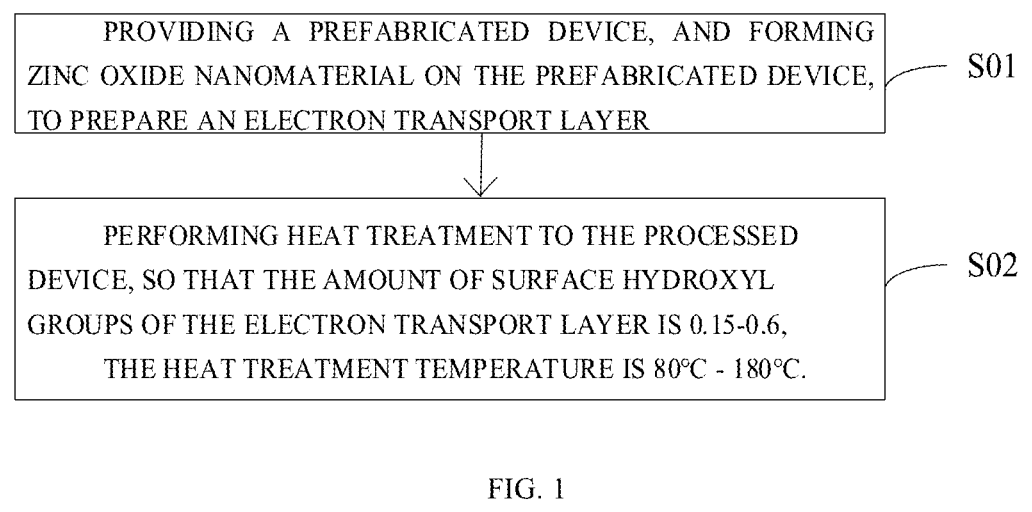

As shown in FIG. 1, the preparation method of quantum dot light emitting diode provided by the embodiments of this disclosure includes the following steps:

S01: providing a prefabricated device, and forming zinc oxide nanomaterial on the prefabricated device, to prepare an electron transport layer;

S02, performing heat treatment to the processed device, so that the amount of surface hydroxyl groups of the electron transport layer is 0.15-0.6.

Through the heat treatment to the device provided with the electron transport layer, the preparation method of quantum dot light emitting diode provided by the embodiments of the disclosure regulates the amount of the surface hydroxyl groups of the electron transport layer, reduces the fluorescence quenching effect of the surface hydroxyl groups of the electron transport layer to the quantum dot light-emitting layer. Meanwhile, the heat treatment may reduce the amount of the surface hydroxyl groups of the electron transport layer. As the number of the surface hydroxyl groups of the zinc oxide decreases, the electron and hole injection balance is optimized, the carrier radiation recombination efficiency is improved, and the EQE of the device and the service life of the device in working state are improved.

In the above step S01, the preparation of quantum dot light emitting diode may be divided into two cases according to the structure (the forward structure and the inverted structure) of the quantum dot light emitting diode.

In one implementation, the prefabricated device is a cathode substrate. In this case, after preparing the electron transport layer, the preparation method provided by the embodiments of this disclosure further includes: preparing a quantum dot light-emitting layer on the electron transport layer, and preparing an anode on the quantum dot light-emitting layer, to obtain the quantum dot light emitting diode. In some embodiments, prior to preparing the anode, the preparation method further includes preparing a hole functional layer on the surface of the quantum dot light-emitting layer, and then preparing the anode on the surface of the hole functional layer. In this case, the hole functional layer includes at least one layer of a hole injection layer, a hole transport layer, and an electron blocking layer. In some embodiments, the prefabricated device includes a cathode substrate and an electron injection layer coupled to the cathode, and the electron transport layer is prepared on the electron injection layer.

In one implementation, the prefabricated device includes an anode substrate, and a quantum dot light-emitting layer coupled to the anode substrate. In this case, after preparing the electron transport layer, the preparation method provided by the embodiments of this disclosure further includes: preparing a cathode on the electron transport layer, to obtain the quantum dot light emitting diode. In some embodiments, the prefabricated device further includes a hole functional layer disposed between the anode substrate and the quantum dot light-emitting layer. In this case, the hole functional layer includes at least one layer of a hole injection layer, a hole transport layer, and an electron blocking layer. In some embodiments, prior to preparing the cathode on the electron transport layer, the preparation method further includes preparing an electron injection layer on the electron transport layer, and then preparing the cathode on the electron injection layer.

In some embodiments, the anode is selected from one or more of indium tin oxide, fluorine-doped tin oxide, indium zinc oxide, graphene, and carbon nanotubes. In some embodiments, the material of the hole injection layer is one or more of PEDOT: PSS, nickel oxide, molybdenum oxide, tungsten oxide, vanadium oxide, molybdenum sulfide, tungsten sulfide, and copper oxide. In some embodiments, the material of the hole transport layer is selected from one or more of PVK, Poly-TPD, CBP, TCTA, and TFB. In some embodiments, the material of the electron transport layer is N-type ZnO, $TiO_2$, SnO, $Ta_2O_3$, ALZnO, ZnSnO, InSnO, $Alq_3$, Ca, Ba, CsF, LiF, $CsCO_3$. In some embodiments, the cathode is selected from one or more of Al, Ca, Ba, and Ag. In one specific embodiment, the anode is selected from indium tin oxide (ITO), the hole injection layer is PEDOT: PSS, the hole transport layer is TFB, the electron transport layer is ZnO, and the cathode is Ag.

In some embodiments, the electron transport layer is prepared by way of a solution processing method. Specifically, the zinc oxide nanomaterial is dissolved in a solvent to prepare a zinc oxide colloidal solution; and then the zinc oxide colloidal solution is formed on the surface of the prefabricated device, and the solvent is removed to prepare the electron transport layer. The solvent is selected from solvents with relatively high polarity and relatively good solubility to zinc oxide, including but not limited to alcohols solvent. For example, the solvent may be at least one selected from methanol, ethanol, propanol, butanol, ethylene glycol, ethylene glycol monomethyl ether, and DMSO. The method of forming the zinc oxide colloidal solution on the surface of the prefabricated device includes, but is not limited to, one of spin coating, blade coating, printing, spraying, roll coating, electrodeposition, and the like.

In this case, as the electron transport layer, the zinc oxide nanomaterial is generally synthesized by sol-gel method, which may be, for example, one of alcoholysis method, hydrolysis method, and the like. The preparation of the zinc oxide nanomaterial is as follows: a zinc salt solution and an alkali solution are mixed, to react to generate hydroxide intermediate such as zinc hydroxide; and a polycondensation reaction of the hydroxide intermediate gradually generate zinc oxide nanoparticles. During the preparation of the zinc oxide, it is possible to obtain zinc oxide with different particle sizes and surface hydroxyl groups by regulating the types of the zinc salt and the alkali, the molar ratio of the zinc salt to the alkali, the reaction time and the reaction temperature. On this basis, it is also possible to obtain zinc oxide nanomaterial with amount of surface hydroxyl groups satisfying different requirements by cleaning and purifying the prepared zinc oxide material and selecting different types of cleaning reagents.

The amount of surface hydroxyl groups of the zinc oxide obtained through different synthesis processes is different. However, in case where the zinc oxide nanoparticles are deposited into a film through a solution method, if the amount of the surface hydroxyl groups is too low, the dispersibility of the zinc oxide in the solvent will be reduced, which may result in a problem of aggregation and sedimentation, and the process of the solution film-forming method will be affected. In order to improve the dispersity of the zinc oxide nanomaterial in the solvent so as to improve the film-forming performance of the zinc oxide nanomaterial, the amount of the surface hydroxyl groups of the zinc oxide needs to be increased. Generally, when preparing the zinc oxide thin film, the amount of surface hydroxyl groups of the zinc oxide is greater than or equal to 0.5, and at this time, a homogeneous dispersion will be obtained by dispersing the zinc oxide in the solvent. However, a relatively high amount of surface hydroxyl groups may quench the quantum dots fluorescence to a certain extent, resulting in poor photoelectric performance (EQE and service life) of the device.

In view of the above, in step S02, the embodiments of this disclosure perform heat treatment to the processed device, to reduce the amount of the surface hydroxyl groups of the electron transport layer, and make the amount of the surface hydroxyl groups of the electron transport layer to be 0.15-0.6. It should be understood that the processed device refers to a device provided with the electron transport layer, which may be a device after the preparation of the electron transport layer, or a device provided with a cathode, an electron transport layer, a quantum dot light-emitting layer, and an anode after being prepared.

In some embodiments, the heat treatment temperature is 80° C.-180° C. In this case, further polycondensation reaction occurs to the surface hydroxyl groups of the zinc oxide under the heating effect, and the number of hydroxyl groups thereof is reduced. Prolong the heat treatment time at different heating temperatures, and the condensation polymerization reaction of the surface hydroxyl groups of the zinc oxide will make the amount of the hydroxyl groups to decrease to a certain value. With the increase of the heating temperature, the faster the polycondensation reaction of the surface hydroxyl groups of the zinc oxide, the lower the amount of the surface hydroxyl groups retained on the zinc oxide film after a certain heating time. In case where the heating temperature is lower than 80° C., the poly condensation reaction of the surface hydroxyl groups of the zinc oxide thin film cannot occur effectively, and it is impossible to regulate the electron mobility of the electron transport layer through the amount of the hydroxyl groups. In some embodiments, the heat treatment time is 1-60 min.

In the embodiments of this disclosure, in order to obtain an electron transport layer with a suitable amount of surface hydroxyl groups, different heat treatment conditions are selected according to the amount of the surface hydroxyl groups of the zinc oxide nanomaterial, since the amount of the surface hydroxyl groups of the zinc oxide nanomaterial are different.

In some embodiments, the amount of the surface hydroxyl groups of the zinc oxide nanomaterial is less than or equal to 0.4, and the heat treatment temperature is 80° C.-100° C. In this case, the amount of the surface hydroxyl groups of the zinc oxide nanomaterial is relatively low. The surface hydroxyl groups of the zinc oxide are sparsely distributed after the zinc oxide nanomaterial is deposited into a thin film, and a faster polycondensation reaction may occur at a low temperature. In case where the heating temperature is greater than 100° C., the zinc oxide of the electron transport layer is prone to excessive heating since the amount of the surface hydroxyl groups of the zinc oxide is low; and in case where the heating temperature is lower than 80° C., it is difficult to achieve the effect of promoting the change of the surface hydroxyl groups of the zinc oxide.

In some embodiments, the amount of the surface hydroxyl groups of the zinc oxide nanomaterial is 0.4-0.8, and the heat treatment temperature is 100° C.-120° C. In this case, the amount of the surface hydroxyl groups of the zinc oxide nanomaterial is in a moderate range, and the hydroxyl groups have a certain quenching effect on the fluorescence of the quantum dot light-emitting layer. The heat treatment at the above-mentioned temperature is beneficial to reducing the fluorescence quenching effect of the surface hydroxyl groups on the quantum dot light-emitting layer. In case where the heat treatment is performed at a temperature higher than 120° C., the change of the decreasing trend of the amount of the hydroxyl groups is relatively fast, and it is likely that an excessive heating results in an aggravated imbalance of the electrons and the holes, and the performance of the device may not be improved as expected; in case where a temperature lower than 100° C. is used to perform the heat treatment, the heating time needs to be prolonged, which may also result in the quenching of the fluorescence of the light-emitting layer.

In some embodiments, the amount of the surface hydroxyl groups of the zinc oxide nanomaterial is greater than or equal to 0.8, and the heat treatment temperature is 130° C.-180° C. In this case, the amount of the surface hydroxyl groups of the zinc oxide nanomaterial is relatively large, and a high-temperature short-time heat treatment will make the amount of the hydroxyl groups to rapidly decrease to a certain level, which may reduce the fluorescence quenching effect of the hydroxyl groups on the interface of the electron transport layer and the light-emitting layer. However, the heating condition at a relatively high temperature will make the amount of the surface hydroxyl groups of the zinc oxide to change quickly, which may result in poor performance due to the crystal phase change of the functional layer thin film or aging at high temperature, etc. In addition, because the number of hydroxyl groups is large, a relatively long heat treatment time is required for low-temperature heat treatment, which may result in quenching of the fluorescence of the light-emitting layer during the reduction of the hydroxyl groups subjected to the polycondensation reaction.

It should be understood that in the quantum dot light emitting diode devices, the electron mobility of the zinc oxide-based electron transport layer is often higher than the hole mobility of the hole transport layer. And quantum dot light emitting diodes of different colors have differences in energy level structures. For a red quantum dot light emitting diode device, it is necessary to properly reduce the electron mobility of the electron transport layer to obtain a better carrier balance. But, with the gradual increase of the position of the light-emitting layer material conduction band, the interface barrier between the quantum dot light-emitting layer and the electron transport layer gradually increases, and the electron injection is made more difficulty in the device. Therefore, the electron mobility of the lighting devices formed by green, blue and other wide-band gap quantum dots need to be higher than that of the red quantum dot light emitting diode devices. For example, the blue quantum dot light emitting diode devices require zinc oxide to have a higher electron mobility at this time.

Since the electron mobility of the zinc oxide thin film is directly related to the amount of the surface hydroxyl groups of the zinc oxide, that is, the electron mobility is low in case where the amount of the hydroxyl groups is high, and the electron mobility is high in case where the amount of the hydroxyl groups is low. Therefore, by way of the above method, the embodiments of this disclosure may regulate the amount of the surface hydroxyl groups of the electron transport layer, so as to balance the carrier injection performance in the device and obtain the device with excellent performance. In some embodiments, the quantum dot light-emitting layer is a red-light quantum dot light-emitting layer, and the amount of the surface hydroxyl groups of the electron transport layer is 0.45-0.6 after the heat treatment. In some embodiments, the quantum dot light-emitting layer is a green-light quantum dot light-emitting layer, and the amount of the surface hydroxyl groups of the electron transport layer is 0.3-0.45 after the heat treatment. In some embodiments, the quantum dot light-emitting layer is a blue-light quantum dot light-emitting layer, and the amount of the surface hydroxyl groups of the electron transport layer is 0.15-0.3 after the heat treatment.

In the embodiments of this disclosure, the time node for processing the heat treatment may have a plurality of options. In some embodiments, it is optional to perform the heat treatment after having prepared the electron transport layer on the preform, that is, the heat treatment occurs after the step of preparing the electron transport layer. In some embodiments, it is optional to perform the heat treatment after preparing the quantum dot light-emitting layer on a first functional layer, preparing a second functional layer on the quantum dot light-emitting layer, and preparing a top electrode on the second functional layer, that is, the heat treatment occurs after the quantum dot light emitting diode has been prepared.

In case where the prefabricated device is the cathode substrate, in some embodiments, the heat treatment may be performed after preparing the electron transport layer on the prefabricated device, that is, the heat treatment occurs after the step of preparing the electron transport layer, or the heat process occurs before the step of preparing the quantum dot light-emitting layer on the electron transport layer. In some embodiments, the heat treatment occurs after the anode has been prepared.

In case where the prefabricated device is the cathode substrate, in some embodiments, the heat treatment is performed to an obtained device after the anode is prepared and before the quantum dot light emitting diode is packaged. In some embodiments, the heat treatment is performed to an obtained device after the anode is prepared and after the quantum dot light emitting diode is packaged.

In case where the prefabricated device includes the anode substrate and the quantum dot light-emitting layer coupled on the anode substrate, in some embodiments, the heat treatment may be performed after the electron transport layer has been prepared on the prefabricated device, that is, the heat treatment occurs after the step of preparing the electron transport layer, or the heat treatment occurs before the step of preparing the cathode on the electron transport layer.

In case where the prefabricated device includes the anode substrate and the quantum dot light-emitting layer coupled on the anode substrate, in some embodiments, the heat treatment occurs after the cathode is prepared. In some embodiments, the heat treatment is performed to an obtained device after the cathode has been prepared and before the quantum dot light emitting diode is packaged. In some embodiments, the heat treatment is performed to an obtained device after the cathode has been prepared and after the quantum dot light emitting diode is packaged.

In the embodiments of this disclosure, it is possible to select the hot plate heating, the oven heating, the infrared heating, and the like, as the heating manner of the heat treatment. The hot plate heating has a uniform and stable heat supply system, and in some embodiments, the heat treatment is performed by way of hot plate heating to reduce the difference in the resulted heat inside the electron transport layer. In some embodiments, after having prepared the top electrode, the method further includes packaging the obtained LED. Of course, the heat treatment may be performed after the device has been packaged.

It should be noted that in the embodiments of this disclosure, the measurements of the amount of the surface hydroxyl groups of the zinc oxide thin film are obtained by using the X-ray photoelectron spectroscopy (XPS) to detect the zinc oxide thin film. Specifically, in the X-ray photoelectron spectroscopy (XPS) detection results, the O1s energy spectrum may obtain three sub-peaks by means of peak separation, respectively being the OM peak (with peak position at 529 eV-531 eV) representing the molar concentration of oxygen atoms in the zinc oxide crystals, the OV peak (with peak position are 531 eV-532 eV) representing the molar concentration of oxygen vacancies in the zinc oxide crystals, and the OH peak (with peak position at 532 eV-534 eV) representing the molar concentration of hydroxyl ligands on the surfaces of the zinc oxide crystals. The area ratios between the respective sub-peaks represent the ratios of the molar concentrations of the different oxygen atoms in the zinc oxide thin film, and therefore, the amount of the surface hydroxyl groups of the zinc oxide film is defined as: the area of the OH peak/the area of the OM peak. That is, the amount of the surface hydroxyl groups of the zinc oxide film is: the ratio of the molar concentration of the hydroxyl ligands on the surface of the zinc oxide thin film to the molar concentration of the oxygen atoms in the zinc oxide crystals.

By depositing a functional layer of zinc oxide thin film on the ITO, the embodiments of the present disclosure use XPS to measure the OM peak of the molar concentration of oxygen atoms in the zinc oxide crystals and the OH peak of the molar concentration of the hydroxyl ligands on the surface of the zinc oxide crystals, so as to monitor the number of the surface hydroxyl groups of the zinc oxide nanomaterial and the change in the number of the surface hydroxyl groups of the electron transport layer under different heat treatments. Also, heat treatments are performed to the zinc oxide thin film at different temperatures and with different time duration, and the OM peak of the molar concentration and the OH peak of the molar concentration are measured. Thereby, quantitative analysis is performed on the number of the surface hydroxyl groups of the zinc oxide.

The following describes with specific embodiments.

Embodiment 1

A preparation method of quantum dot light emitting diode, includes:

- spin coating PEDOT: PSS on the anode ITO 1 to prepare the hole injection layer 2; spin coating TFB on the hole injection layer 2 to prepare the hole transport layer 3; spin coating CdZnSe/ZnSe/ZnS red quantum dots on the hole transport layer 3 to prepare the quantum dot light-emitting layer 4; spin coating ZnO, the amount of whose surface hydroxyl groups is 0.9, on the quantum dot light-emitting layer 4 to prepare the electron transport layer 5; and evaporation depositing Al to prepare the cathode 6, and packaging to form a quantum dot electroluminescent device.

The packaged device is placed on a hot plate of 150° C. to be baked for 10 min, to perform the heat treatment.

In case where the quantum dot light emitting diode is prepared by the method provided in Embodiment 1, the schematic diagram showing the changes in the hydroxyl groups in the electron transport layer before and after the heating is shown in FIG. 2.

Comparative Example 1

The preparation method of quantum dot light emitting diode device in Comparative Example 1 is substantially the same as that of Embodiment 1, except that the heat treatment is not performed.

Embodiment 2

A preparation method of quantum dot light emitting diode, differs from Embodiment 1 in the following: spin coating ZnO, the amount of whose surface hydroxyl groups is 0.7, on the quantum dot light-emitting layer to prepare the electron transport layer; and placing the packaged device on a hot plate of 100° C. to bake for 20 min, to perform the heat treatment.

Comparative Example 2

The preparation method of quantum dot light emitting diode device in Comparative Example 2 is substantially the same as that of Embodiment 2, except that the heat treatment is not performed.

Embodiment 3

A preparation method of quantum dot light emitting diode, differs from Embodiment 2 in the following: the quantum dots in the quantum dot light-emitting layer are green quantum dots CdZnSeS/ZnS; and placing the packaged device on a hot plate of 100° C. to bake for 30 min, to perform the heat treatment.

Comparative Example 3

The preparation method of quantum dot light emitting diode device in Comparative Example 3 is substantially the same as that of Embodiment 3, except that the heat treatment is not performed.

Embodiment 4

A preparation method of quantum dot light emitting diode, differs from Embodiment 1 in the following: the quantum dots in the quantum dot light-emitting layer are blue quantum dots CdSeS/ZnSe/ZnS, spin coating ZnO, the amount of whose surface hydroxyl groups is 0.6, on the quantum dot light-emitting layer to prepare the electron transport layer; and placing the packaged device on a hot plate of 150° C. to bake for 50 min, to perform the heat treatment.

Comparative Example 4

The preparation method of quantum dot light emitting diode device in Comparative Example 4 is substantially the same as that of Embodiment 4, except that the heat treatment is not performed.

Embodiment 5

A preparation method of quantum dot light emitting diode, differs from Embodiment 4 in the following: spin coating ZnO, the amount of whose surface hydroxyl groups is 0.35, on the quantum dot light-emitting layer to prepare the electron transport layer; and placing the packaged device on a hot plate of 150° C. to bake for 30 min, to perform the heat treatment.

Comparative Example 5

The preparation method of quantum dot light emitting diode device in Comparative Example 5 is substantially the same as that of Embodiment 5, except that the heat treatment is not performed.

The photoelectric performance and service life of the quantum dot light emitting diode devices prepared in Embodiments 1-5 and Comparative Examples 1-5 are tested, in which the service life tests of the device adopt a 128-channel life test system customized by Guangzhou New Vision Corporation. The system architecture is as follows: a constant-voltage constant-current power supply drives the QLED, to test voltage or current changes; a photodiode detector and test system test the brightness (photocurrent) change of the QLED; and a brightness meter tests the brightness (photocurrent) of a calibrated QLED. The test results are shown in Table 1 below, where EL represents an electroluminescent peak position of the quantum dot light emitting diode device, FWHM represents the half-peak width, EQE represents the external quantum efficiency of the quantum dot light emitting diode device, CE represents the current efficiency of the quantum dot light emitting diode device, and T95@1000 nit represents the operational lifetime of the quantum dot light emitting diode device in the constant-current mode, that is, the time spent for the brightness which is converted to 1000 nit to decay to 95%.

TABLE 1

| | EL (nm) | FWHM (nm) | EQE (%) | CE (cd/A) | T95@1000 nit (h) |
|---|---|---|---|---|---|
| Embodiment 1 | 633 | 23 | 19 | 17 | 2870 |
| Embodiment 2 | 633 | 23 | 18 | 16.5 | 2500 |
| Embodiment 3 | 540 | 24 | 20 | 90 | 4860 |
| Embodiment 4 | 475 | 26 | 14 | 12 | 85 |
| Embodiment 5 | 475 | 26 | 12 | 10.5 | 98 |
| Comparative Example 1 | 633 | 23 | 8 | 7.2 | 560 |
| Comparative Example 2 | 633 | 23 | 7.6 | 6.6 | 380 |
| Comparative Example 3 | 540 | 24 | 9 | 38 | 680 |
| Comparative Example 4 | 475 | 26 | 3.5 | 2.3 | 8 |
| Comparative Example 5 | 475 | 26 | 4 | 3.2 | 12 |

It can be seen from Table 1 that, as compared with the comparative examples, the quantum dot light emitting diodes prepared in the embodiments of the present disclosure have better external quantum efficiency and service life. This is due to the fact that after the heat treatment to the zinc oxide material, the amount of the surface hydroxyl groups is regulated, the fluorescence quenching effect of the surface hydroxyl groups of the zinc oxide in the electron transport layer on the quantum dot light-emitting layer is reduced, the electron and hole injection balance is optimized, and the carrier radiation recombination efficiency is improved.

The above are merely preferred embodiments of the present disclosure and are not intended to limit the present disclosure. Any modification, equivalent replacement, improvement, etc. made within the spirit and principle of the present disclosure should be included within the protection scope of the present disclosure.

What is claimed is:

1. A preparation method of quantum dot light emitting diode, comprising steps of:

providing a prefabricated device, and forming zinc oxide nanomaterial on the prefabricated device, to prepare an electron transport layer;

packaging the quantum dot light emitting diode to obtain a quantum dot electroluminescent device;

placing the obtained quantum dot electroluminescent device on a hot plate to perform heat treatment on the quantum dot electroluminescent device, such that an amount of surface hydroxyl groups of the electron transport layer is 0.15-0.6;

wherein the heat treatment temperature is 80° C.-180° C., and the heat treatment time is 1-60 min;

wherein the quantum dot light-emitting layer is a red-light quantum dot light-emitting layer, and the amount of the surface hydroxyl groups of the electron transport layer is 0.45-0.6, or alternatively, the quantum dot light-emitting layer is a green-light quantum dot light-emitting layer, and the amount of the surface hydroxyl groups of the electron transport layer is 0.3-0.45, or alternatively, the quantum dot light-emitting layer is a blue-light quantum dot light-emitting layer, and the amount of the surface hydroxyl groups of the electron transport layer is 0.15-0.3.

2. The preparation method of quantum dot light emitting diode according to claim 1, wherein the amount of the surface hydroxyl groups of the zinc oxide nanomaterial is less than or equal to 0.4, and the heat treatment temperature is 80° C.-100° C.

3. The preparation method of quantum dot light emitting diode according to claim 1, wherein the amount of the surface hydroxyl groups of the zinc oxide nanomaterial is 0.4-0.8, and the heat treatment temperature is 100° C.-120° C.

4. The preparation method of quantum dot light emitting diode according to claim 1, wherein the amount of the surface hydroxyl groups of the zinc oxide nanomaterial is greater than or equal to 0.8, and the heat treatment temperature is 130° C.-180° C.

5. The preparation method of quantum dot light emitting diode according to claim 1, wherein the prefabricated device is a cathode substrate;

after having prepared the electron transport layer, the method further comprises steps of:

preparing a quantum dot light-emitting layer on the electron transport layer, and preparing an anode on the quantum dot light-emitting layer, to obtain the quantum dot light emitting diode.

6. The preparation method of quantum dot light emitting diode according to claim 1, wherein the prefabricated device comprises an anode substrate, and a quantum dot light-emitting layer coupled to the anode substrate;

after having prepared the electron transport layer, the method further comprises a step of:

preparing a cathode on the electron transport layer, to obtain the quantum dot light emitting diode.

7. The preparation method of quantum dot light emitting diode according to claim 5, wherein the anode is selected from one or more of indium tin oxide, fluorine-doped tin oxide, indium zinc oxide, graphene, and carbon nanotubes.

8. The preparation method of quantum dot light emitting diode according to claim 5, wherein material of a hole injection layer is one or more of PEDOT: PSS, nickel oxide, molybdenum oxide, tungsten oxide, vanadium oxide, molybdenum sulfide, tungsten sulfide, and copper oxide.

9. The preparation method of quantum dot light emitting diode according to claim 5, wherein material of a hole transport layer is selected from one or more of PVK, Poly-TPD, CBP, TCTA, and TFB.

10. The preparation method of quantum dot light emitting diode according to claim 5, wherein the cathode is selected from one or more of Al, Ca, Ba, and Ag.

11. The preparation method of quantum dot light emitting diode according to claim 5, wherein heating manner of the heat treatment is hot plate heating, oven heating, or infrared heating.

* * * * *